United States Patent [19]
Imaizumi et al.

[11] Patent Number: 5,171,826
[45] Date of Patent: Dec. 15, 1992

[54] HEAT RESISTANT ADHESIVE COMPOSITION AND BONDING METHOD USING THE SAME

[75] Inventors: Junichi Imaizumi, Shimodate; Hiroshi Nomura, Oyama; Kouichi Nagao, Shimodate; Masakatsu Suzuki, Shimodate; Koushi Sakairi, Shimodate; Eikichi Satou, Oyama, all of Japan

[73] Assignee: Hitachi Chemical Company, Ltd., Tokyo, Japan

[21] Appl. No.: 792,027

[22] Filed: Nov. 13, 1991

Related U.S. Application Data

[62] Division of Ser. No. 495,362, Mar. 16, 1990, Pat. No. 5,089,346.

[30] Foreign Application Priority Data

Mar. 23, 1989 [JP] Japan .................................. 1-71571
Oct. 6, 1989 [JP] Japan ................................. 1-262507

[51] Int. Cl.⁵ .............................................. C08G 69/12
[52] U.S. Cl. ...................................... 528/322; 524/233
[58] Field of Search ........................ 528/322; 524/233

[56] References Cited

U.S. PATENT DOCUMENTS 4,130,469 12/1978 McGinniss .......................... 428/458
4,543,295 9/1985 St. Claim et al. ................... 428/458
4,765,860 8/1988 Ueno et al. ....................... 156/272.6

Primary Examiner—Paul R. Michl
Assistant Examiner—Edward Cain
Attorney, Agent, or Firm—Frishauf, Holtz, Goodman & Woodward

[57] ABSTRACT

A heat resistant adhesive composition comprising a specific polyamic acid solution and a bis-maleimide compound exhibits flexibility and excellent heat resistance after bonding two material bodies, and therefore, it can be suitably used for producing of flexible metal-clad laminates, double-sided flexible metal-clad laminates, and multilayer printed circuit boards, and for attaching coverlay films to printed circuit boards.

9 Claims, 3 Drawing Sheets

♦ EXAMPLE 5 (COPPER/POLYIMIDE INTERFACE)
▫ EXAMPLE 5 (POLYIMIDE/ADHESIVE INTERFACE)
▲ COMPARATIVE EXAMPLE
    (POLYIMIDE/ADHESIVE INTERFACE)

HEAT RESISTANT ADHESIVE COMPOSITION AND BONDING METHOD USING THE SAME

This is a division of application Ser. No. 07/495,362 filed Mar. 16, 1990, now U.S. Pat. No. 5,089,346.

BACKGROUND OF THE INVENTION (a) Field of the Invention

The present invention relates to a heat resistant adhesive composition which is extremely excellent in heat resistance and further, has flexibility, and to a method of bonding two material bodies by using it. Particularly, the present invention relates to a heat resistant adhesive composition which is useful particularly for production of flexible printed boards and multilayer flexible printed boards, and to a method of bonding two material bodies using the heat resistant adhesive composition, the method being particularly suitable for the production of these flexible printed boards.

(b) Description of the Related Art

Flexible printed boards generally have been produced by attaching a sheet of metal foil to a polyimide film as a base film using pressure with an adhesive being disposed between them, then removing unnecessary portions of the metal foil to make a printed circuit, and finally protecting the printed circuit with a coverlay film or a solder resist ink. However, the adhesives which have been mainly used for the method are epoxy adhesives or acrylic adhesives, which are inferior in heat resistance. Therefore, although polyimides, which have good heat resistance, have been used as the base film, the adhesives have characterized the properties of the flexible printed boards, and the excellent heat resistance of the polyimides could not be reflected sufficiently in the flexible printed boards. For instance, the flexible printed boards produced by using such adhesives have been of such a low soldering heat resistance as about 300° C. There have been another problem that even if the flexible printed board had a bond strength of 1.5 kgf/cm at room temperature, it is reduced to 0.5 kgf/cm or less when temperature exceeded 100° C.

In order to solve these problems, we have developed adhesives which have good heat resistance and flexibility and can be used as the adhesives for the production of flexible printed boards without causing substantial deterioration in the properties of the flexible printed boards, such as heat resistance. The adhesives however are expensive and require a high temperature higher than 250° C. for thermopressing.

With regard to the method of producing one-sided metal-clad laminates, there has been developed a method called direct coating method, wherein a laminate is produced by directly coating a sheet of metal foil with a polyimide without using adhesives. However, this method cannot be used for producing double-sided flexible metal-clad laminates, for laminating coverlay films on printed boards or for laminating one-sided flexible metal-clad laminates or printed boards to produce double-sided flexible metal-clad laminates or multilayer flexible printed boards.

SUMMARY OF THE INVENTION

An object of the present invention is to provide a heat resistant adhesive composition which enables substantially making use of the excellent heat resistance of polyimide film used as the base insulating material for flexible printed boards, has flexibility, which is an important characteristic of flexible printed boards, and enables thermopressing at about 250° C. or lower.

Another object of the present invention is to provide a method of bonding material bodies by using the heat resistant adhesive composition.

As the result of research in heat resistant adhesives which are usable for producing flexible printed boards and multilayer flexible printed boards and for bonding coverlay film to printed circuit boards, which excel over conventional epoxy adhesives and acrylic adhesives both in flexibility and heat resistance, and can be used for thermopressing at 250° C. or less, we have found that the above-described problems can be overcome by an adhesive composition comprising a polyamic acid and a bis-maleimide compound as essential ingredients, and we consequently completed the present invention.

That is, the present invention provides a heat resistant adhesive composition comprising (A) a polyamic acid solution comprising a polyamic acid and a solvent, the polyamic acid being able to be converted into a polyimide having a glass transition temperature not higher than 260° C. by heating the polyamic acid to dehydrate the polyamic acid and (B) a bis-maleimide compound in an amount of from 20 to 60 parts by weight per 100 parts by weight of the polyamic acid.

The present invention further provides a method of bonding two material bodies to each other comprising (a) coating a surface of at least one of the material bodies with a heat resistant adhesive composition, the heat resistant adhesive composition comprising (A) a polyamic acid solution comprising a polyamic acid and a solvent, the polyamic acid being able to be converted into a polyimide having a glass transition temperature not higher than 260° C. by heating the polyamic acid to dehydrate the polyamic acid and (B) a bis-maleimide compound in an amount of from 20 to 60 parts by weight per 100 parts by weight of the polyamic acid, (b) heating the heat resistant adhesive composition coating the surface of the at least one of the material bodies so that the solvent is removed from the heat resistant adhesive composition and conversion of the polyamic acid into the polyimide starts and proceeds, (c) bringing the coated surface of the at least one of the material bodies into contact with a surface of the other material body to form a composite, and (d) thermopressing the composite by simultaneously pressing the composite and heating the composite at a temperature not lower than the temperature for thermosetting of the bis-maleimide compound to convert the bis-maleimide compound into a poly-bis-maleimide.

After curing during the bonding procedure, the heat resistant adhesive composition of the present invention exhibits excellent heat resistance, chemical stability, flame resistance, and flexibility. Further, it can adhere to material bodies at a relatively low temperature of about 250° C. or lower.

DESCRIPTION OF THE PREFERRED EMBODIMENTS

Figure 1:
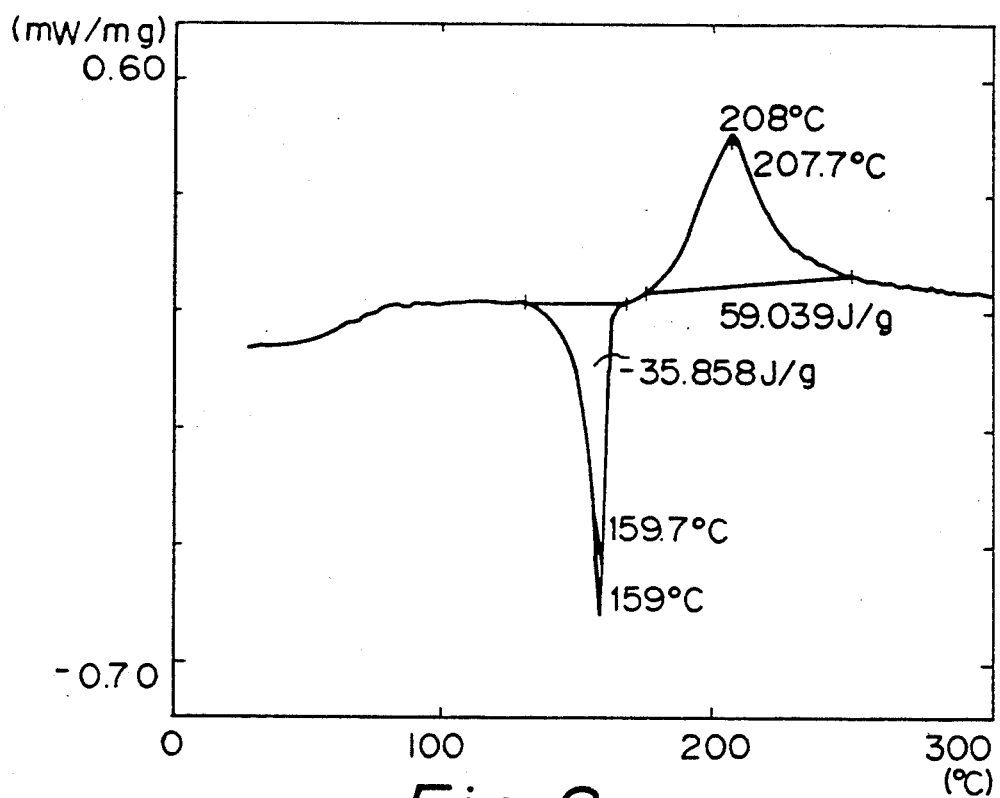
FIG. 1 is a graph showing a DSC curve of N,N'-(methylene-di-p-phenylene)bis-maleimide.

The polyamic acid to be used in the present invention can be converted into a polyimide having a glass transition temperature not higher than 260° C., preferably not higher than 250° C., by heating the polyamic acid to dehydrate the polyamic acid. If the glass transition temperature is higher than 260° C., the heat resistant adhesive composition will require a higher temperature at the time of thermopressing. Herein, "thermopressing" means attaching two material bodies to each other with an adhesive being disposed between them by using pressure and heat. In the presence of the above-described amount of bis-maleimide compounds, polyimides generally transfer to a glass state at a temperature at least about 10° C. lower than their glass transition temperatures. Therefore, the polyimide converted from the polyamic acid in the heat resistant adhesive composition of the present invention does not require a temperature higher than about 250° C. to adhere to the surfaces of the material bodies to be bonded to each other. That is, the heat resistant adhesive composition can be used for thermopressing at a temperature of about 250° C. or lower. In addition, if the glass transition temperature of the polyimide is extremely high, the temperature for onset of polymerization of the polyamic acid may become higher than the temperature for thermosetting of the bis-maleimide compound. In such a case, the bis-maleimide compound is cross-linked while the polyamic acid is converting into polyimide, and adhesion of the bis-maleimide ingredient to the material bodies at the time of thermopressing becomes difficult.

Herein, measurement of "glass transition temperature" was conducted by using a thermal mechanical analyzer under the condition of 10° C./min, and the glass transition temperature was determined by the change of thermal expansion ratio caused by glass transition. Also, measurement of "temperature for thermosetting of bis-maleimide compound" was conducted by using a differential scanning colorimeter (DSC) under the condition of 10° C./min.

The preferred example of the polyamic acid is linear polyamic acids, i.e. uncross-linked polyamic acids, because polyimide derived from linear polyamic acids generally have relatively low glass transition temperature.

The preferred examples of the linear polyamic acids which may be used in the present invention have the repeating units represented by the following general formula (1):

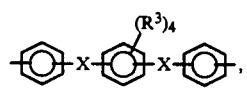

wherein
$R^1$ is

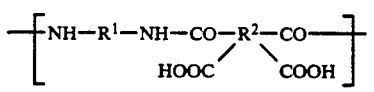

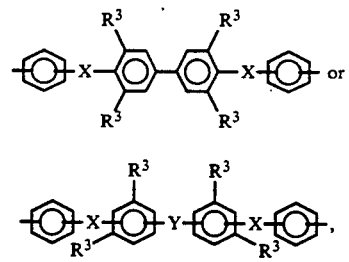

each $R^3$, respectively, being hydrogen, a halogen or an alkyl group of from 1 to 4 carbon atoms and
each X and Y, respectively, being

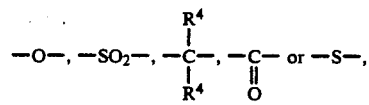

each $R^4$, respectively, being hydrogen, an alkyl group of from 1 to 4 carbon atoms or $-CF_3$,
$R^2$ is

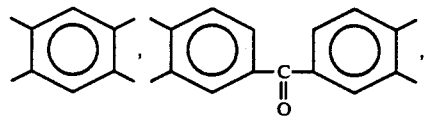

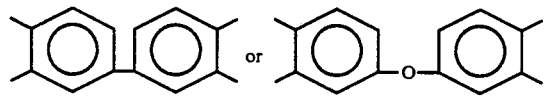

The polyamic acids having the repeating units represented by the general formula (1) are obtainable, for example, by allowing equimolecular quantities of an aromatic amine having an $R^1$ group or a derivative thereof and a tetracarboxylic acid having an $R^2$ group or a derivative thereof to react in a proper solvent at a temperature of from 0° to 150° C.

Some illustrative examples of the aromatic amine having $R^1$ include
1,3-bis(3-aminophenoxy)benzene,
1,3-bis(4-aminophenoxy)benzene,
1,4-bis(4-aminophenoxy)benzene,
4,4'-bis(4-aminophenoxy)biphenyl,
bis[4-(3-aminophenoxy)phenyl]sulfone,
bis[4-(4-aminophenoxy)phenyl]sulfone,
2,2-bis[4-(4-aminophenoxy)phenyl]propane,
2,2-bis[4-(4-aminophenoxy)phenyl]hexafluoropropane,
2,2-bis[4-(3-aminophenoxy)phenyl]propane, and
2,2-bis[4-(3-aminophenoxy)phenyl]hexafluoropropane.
Among these, the preferred examples are bis[4-(3-aminophenoxy)phenyl]sulfone and bis[4-(4-aminophenoxy)phenyl]sulfone. Diisocyanates derived from these aromatic amines may also be used.

The $R^1$ group largely influences on the glass transition temperatures of the polyamic acid and the polyimide derived from the polyamic acid. In order to lower the temperature for thermopressing, it is important to design the molecular structure so as to lower the glass transition temperature, and it is preferable to use a diamine having at least three benzene nuclei or a derivative thereof which further preferably has metabondings. In addition to the above-described diamines, diamines having one benzene nucleus such as o-phenylenediamine, m-phenylenediamine, p-phenylenediamine, 2,4-diaminotoluene, 2,5-diaminotoluene, and 2,4-diaminoxylene, and diaminodurene, diamines having two benzene nucleuses such as benzidine, 4,4'-diaminodiphenylmethane, 4,4'-diaminodiphenyl ether, 3,4'-diaminodiphenyl ether, 4,4'-diaminodiphenyl sulfone, and 3,3'-diaminodiphenyl sulfone may also be used, with the proviso that the accomplishment of the object of the present invention is not disturbed.

Some examples of the tetracarboxylic acid having a $R^2$ group or a derivative thereof include pyromellitic acid,
2,3,3',4'-tetracarboxybiphenyl,
3,3',4,4'-tetracarboxybiphenyl,
3,3',4,4'-tetracarboxydiphenyl ether,
2,3,3',4'-tetracarboxydiphenyl ether,
3,3',4,4'-tetracarboxybenzophenone,
2,3,3',4'-tetracarboxybenzophenone,
esters thereof, anhydrides thereof, and acyl chloride derived therefrom.

Mixtures of two or more of these polyamic acids may also be used. Further, polyamic acids each having two or more kinds of $R^1$ groups or two or more kinds of $R^2$ groups may also be used.

The particularly preferred polyamic acid has the repeating units represented by the following general formula (2)

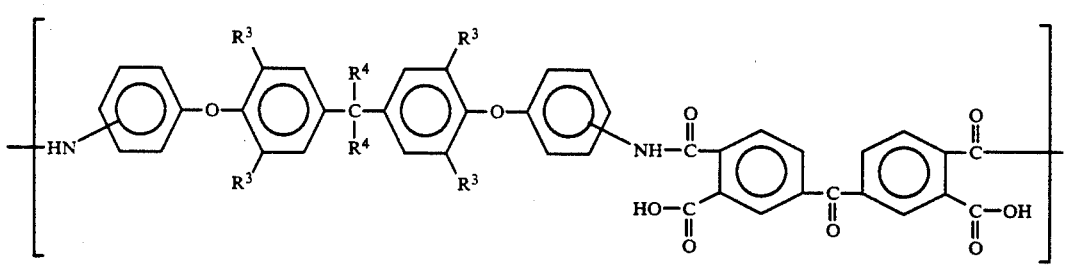

wherein
each $R^3$, respectively, is hydrogen, a halogen or an alkyl group or from 1 to 4 carbon atoms, and
each $R^4$, respectively, is hydrogen, an alkyl group of from 1 to 4 carbon atoms or —$CF_3$.

The reaction solution, which is obtained after completion of the preparation of the polyamic acid and contains the solvent used for the reaction, may be used as the polyamic acid solution to be used in the present invention. It is therefore important to select properly the solvent to be used for the preparation of the polyamic acid. A solvent removal of which requires a temperature extremely higher than the temperature for the thermosetting of the bis-maleimide compound is undesirable because the removal of the solvent makes the bis-maleimide compound start cross-linking prior to thermopressing, thereby causing difficulty, at the time of thermopressing, in adhering of the bis-maleimide ingredient to material bodies to be bonded. On the other hand, if the solvent remains in the adhesive layer, it also causes problems such as bulging or delamination of the bonded product at the time of thermopressing or at the time of reflowing the bonded product on solder.

Some examples of the solvent which can be used both for preparation of the polyamic acid and for preparation of the polyamic acid solution include N-methyl-2-pyrrolidone (NMP), N,N-dimethylformamide (DMF), N,N-dimethylacetamide (DMAc), dimethyl sulfoxide (DMSO), phenol, halogenized phenols, 1,4-dioxane, γ-butyrolactone, tetrahydrofuran, and diethyleneglycol dimethyl ether. The preferred examples are N,N-dimethylacetamide and N,N-dimethylformamide.

These solvents may be used individually or in a form of a mixture of two or more of them.

The weight ratio between the polyamic acid and the solvent is preferably from 5:95 to 25:75. Generally, it is preferable that the polyamic acid solution has a rotation viscosity of more than 500 poise.

The heat resistant adhesive composition of the present invention is prepared by adding a bis-maleimide compound to the polyamide acid solution prepared as described above.

The bis-maleimide compound to be used in the present invention is not limited, and some examples of the bis-maleimide compound are represented by the following general formula (3).

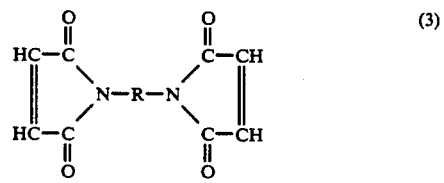

Some examples of the bis-maleimide compound represented by the general formula (3) include
N,N'-m-phenylene-bis-maleimide,
N,N'-p-phenylene-bis-maleimide,
N,N'-(oxy-di-p-phenylene)bis-maleimide,
N,N'-(methylene-di-p-phenylene)bis-maleimide,
N,N'-(sulfone-di-p-phenylene)bis-maleimide, and
2,2-bis(maleimide-phenoxyphenyl)propanes.

These bis-maleimide compounds may be used individually or as a mixture of two or more of them.

The amount of the bis-maleimide compound added is from 20 to 60 parts by weight, preferably from 30 to 50 parts by weight, per 100 parts by weight of the polyamic acid in the polyamic acid solution. If the amount of the bis-maleimide compound is less than 20 parts by weight, the heat resistant adhesive compositions will require higher temperature at the time of thermopressing. On the other hand, if it exceeds 100 parts by weight, the elongation and flexibility of the heat resistant adhesive composition will be reduced.

Thus prepared heat resistant adhesive composition is applied to at least one of two material bodies to coat at least one of the two surfaces to be bonded with the heat resistant adhesive composition. There is no particular limit in the method of application.

The material bodies to be bonded by the method of the present invention not particularly limited. Some examples of the preferred combination include polyimide/polyimide, polyimide/metal, and metal/metal.

Because the heat resistant adhesive composition of the present invention exhibits excellent heat resistance and flexibility, it is particularly useful for producing a flexible printed board with a coverlay film, a two-layer flexible metal-clad laminate, which is composed of a sheet of metal foil and a polyimide film, and a double-sided flexible metal-clad laminate, which is composed of two sheets of metal foil and a polyimide layer disposed between the two sheets of metal foil.

In the production of a flexible printed board with a coverlay film, generally, one of the material bodies to be bonded is a coverlay film, and the other is a flexible printed board, the circuit surface of which is to be covered with the coverlay film.

In production of a flexible metal-clad laminate, generally, one of the material bodies to be bonded is a sheet of metal foil, and the other is a sheet of polyimide film.

In production of a double-sided flexible metal-clad laminate, generally, one of the material bodies to be bonded is a sheet of metal foil or a two-layer flexible metal-clad laminate composed of a sheet of metal foil and a polyimide layer, and the other is a two-layer flexible metal-clad laminate composed of a sheet of metal foil and a polyimide layer. In the former case, the heat resistant adhesive composition is applied to one surface of the metal foil, or to the surface of the polyimide layer of the two-layer flexible metal-clad laminate, or to both of the surfaces. In the latter case, the heat resistant adhesive composition is applied to the surface of the polyimide layer of at least one of the two-layer flexible metal-clad laminates.

Examples of the metal foil to be used in these methods include copper foil, aluminum foil, and aluminum-clad copper foil.

The two-layer flexible laminates to be used in the above-described methods of producing double-sided flexible metal-clad laminates are not particularly limited. The preferred two-layer flexible laminates are those produced by casting a polyamic acid varnish comprising a polyamic acid and a solvent on a sheet of copper foil, and removing the solvent and converting the polyamic acid into a polyimide by heating, and preferably, the thermal expansion coefficient of the polyimide converted from the polyamic acid is about equal to that of the copper foil.

In order to attain high bond strength, it is preferable to apply the heat resistant adhesive composition to both material bodies to be bonded. It is also preferable to treat the surfaces of the material bodies by mechanical or chemical treatment. Some examples of such treatment include polishing with brush, sand blasting, coupling agent treatment, plasma treatment, corona treatment, alkali treatment, and acid treatment. In particular, when the material body to be bonded is polyimide film or a laminate having polyimide film on its surface to be bonded, plasma treatment is very effective to attain high bond strength.

Plasma treatment may be carried out either continuously or batchwise. From the view point of production efficiency, continuous process is preferable. The gas to be used for plasma treatment may be oxygen, nitrogen, helium, argon, or $CF_4$, but it is not limited to these, and gas may be used individually or as a mixture of two or more kinds of gas. The pressure of the treatment is preferably from 0.08 to 0.15 torr, and the plasma power density (throwing electric power/area of electrode) is preferably from 0.2 to 100 $W/cm^2$, more preferably from 0.5 to 50 $W/cm^2$. The time for the plasma treatment is preferably from 10 seconds to 30 minutes or more, but it depends on the other conditions.

Subsequently, the heat resistant adhesive composition on the material body is heated to remove the solvent therefrom and to make the conversion of the polyamic acid into polyimide start and proceed.

In this stage, one of the important points is the temperature for heating. If the material body is heated at a temperature extremely higher than the temperature for thermosetting of the bis-maleimide compound, the bis-maleimide compound will be polymerized and cross-linked and will find difficulty in adhering to the material bodies to be bonded. It is preferable to prevent the temperature for heating from exceeding the temperature for thermosetting of the bis-maleimide compound by 180° C. It is more preferable to keep the temperature lower than the temperature for thermosetting of the bis-maleimide compound.

The time for heating depends on the kind of the solvent, the kind of the polyamic acid, the temperature for heating, etc., but it is generally less than 30 minutes.

The residual volatile material (solvent) content of the adhesive layer after this heating stage is preferably not more than 5% by weight, more preferably not more than 3% by weight, further more preferably not more than 2% by weight. If a large amount of volatile material remains, undesirable phenomenon such as bulging or delamination of the bonded products will be caused by evaporation of the residual volatile material when thermopressing is carried out or bonded products are exposed to high temperature later.

After removal of the solvent and conversion of the polyamic acid to polyimide, the coated surface of the at least one of the material bodies to be bonded is brought into contact with a surface of the other material body to form a composite.

Lastly, the composite is thermopressed to convert the bis-maleimide compound into poly-bis-maleimide and to make the adhesive adhere securely to the two material bodies to be bonded. The thermopressing should be carried out at a temperature not lower than the glass transition temperature of the polyimide converted from the polyamic acid and not lower than the temperature for thermosetting of the bis-maleimide compound. The pressure for thermopressing is preferably not lower than 10 $kgf/cm^2$, but it is not particularly limited. The time for the thermopressing is not particularly limited as long as secure adhesion of the adhesive and conversion of the bis-maleimide compound to poly-bis-maleimide can be attained.

Figure 3:
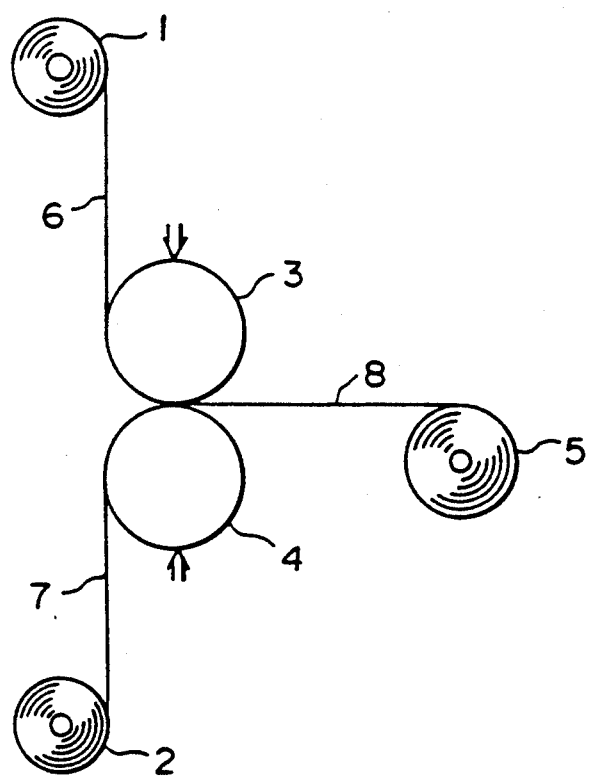
FIG. 3 is a perspective view of a roll laminating machine.

The technique for thermopressing is not particularly limited. It is preferable to carry out the thermopressing continuously by passing the composite through a pair of rollers at least one of which is a heating roller. FIG. 3 shows a perspective view of a roll laminating machine suitable for the continuous thermopressing. Referring to FIG. 3, two lengthy material bodies 6 and 7 to be bonded to each other are fed from two rolls 1 and 2 respectively, and they are brought into contact each other and thermopressed simultaneously by passing them through a pair of heating rolls 3 and 4, and the thermopressed product 8 is wound on a winding roll 5. In the method of the present invention, at least one of the lengthy sheets 6 and 7 is coated with the heat resistant adhesive composition of the present invention between the rolls 1 and 2 and the roll laminating machine (3 and 4).

The following examples are presented to describe the present invention in more detail. It should be understood, however, that the invention is not limited to the specific details set forth in the examples.

EXAMPLES 1 TO 5 AND COMPARATIVE EXAMPLES 1 TO 5

PREPARATION EXAMPLE 1

Into a 60-1 stainless reaction vessel equipped with a thermocouple, a stirrer, a nitrogen inlet, and a capacitor, charged were 4.20 kg of 2,2-bis[4-(4-aminophenoxy)phenyl]propane and 42.5 kg of N,N-dimethylacetamide, and the mixture was stirred to dissolve 2,2-bis[4-(4-aminophenoxy)]propane, while 30 ml/min of dried nitrogen was passed through the reaction vessel. While the obtained solution was cooled to not higher than 20° C., 3.30 kg of 3,3',4,4'-benzophenone tetracarboxylic dianhydride was added slowly in the solution to carry out polymerization, and a sticky solution of the polyamic acid having the repeating unit represented by the following formula was obtained.

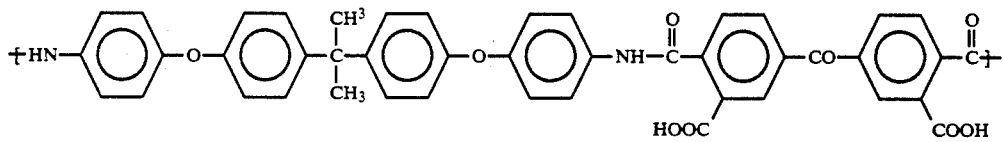

In order to facilitate future application procedure, the solution of the polyamic acid was heated at 80° C. until the rotation viscosity of the solution increased up to about 200 poise. After the heating, the polyamic acid content in the solution was 7.5 kg (15% by weight). The polyimide converted from the polyamic acid having the above repeating unit had a glass transition temperature of 245° C.

Subsequently, the polyamic acid solution was cooled to 40° C., and to the cooled polyamic acid solution added was 1.50 kg of N,N'-(methylene-di-p-phenylene)-bis-maleimide represented by the following formula, the amount corresponding to 20 parts by weight per 100 parts by weight of the polyamic acid, and was dissolved in the solution, to obtain an adhesive composition.

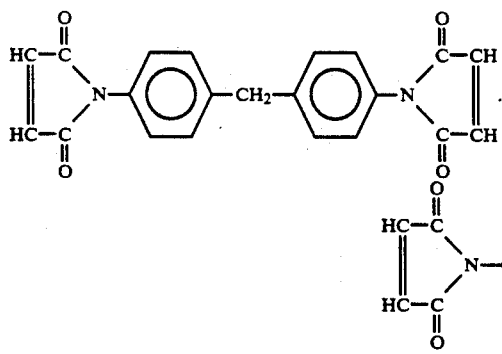

The temperature for thermosetting of N,N'-(methylene-di-p-phenylene)bis-maleimide were measured using a DSC to be about from 180° C. to about 240° C. with a peak of about 210° C. FIG. 1 shows the DSC curve of N,N'-(methylene-di-p-phenylene)bis-maleimide. The time for onset of curing of N,N'-(methylene-di-p-phenylene)bis-maleimide was measured using a curastmeter to be 6 minutes at 180° C.

PREPARATION EXAMPLE 2

The procedure of Preparation Example 1 was repeated with the exception that the amount of N,N'-(methylene-di-p-phenylene)bis-maleimide added was changed to 10 parts by weight per 100 parts by weight of the polyamic acid, i.e. to 0.75 kg, to obtain an adhesive composition.

PREPARATION EXAMPLE 3

The procedure of Preparation Example 1 was repeated with the exception that the amount of N,N'-(methylene-di-p-phenylene)bis-maleimide added was changed to 40 parts by weight per 100 parts by weight of the polyamic acid, i.e. to 3.00 kg, to obtain an adhesive composition.

PREPARATION EXAMPLE 4

The procedure of Preparation Example 1 was repeated with the exception that the amount of N,N'-(methylene-di-phenylene)bis-maleimide added was changed to 60 parts by weight per 100 parts by weight of the polyamic acid, i.e. to 4.50 kg, to obtain an adhesive composition.

PREPARATION EXAMPLE 5

The procedure of Preparation Example 1 was repeated with the exception that the amount of N,N'-(methylene-di-p-phenylene)bis-maleimide added was changed to 80 parts by weight per 100 parts by weight of the polyamic acid, i.e. to 6.00 kg, to obtain an adhesive composition.

PREPARATION EXAMPLE 6

The procedure of Preparation Example 1 was repeated with the exception that in place of N,N'-(methylene-di-p-phenylene)bis-maleimide, 4.50 kg, i.e. 60 parts by weight of 2,2-bis[maleimide-4-(4-phenoxy)phenyl]propane represented by the following formula was used per 100 parts by weight of the polyamic acid, to obtain an adhesive composition.

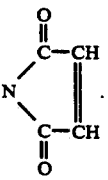

Figure 2:
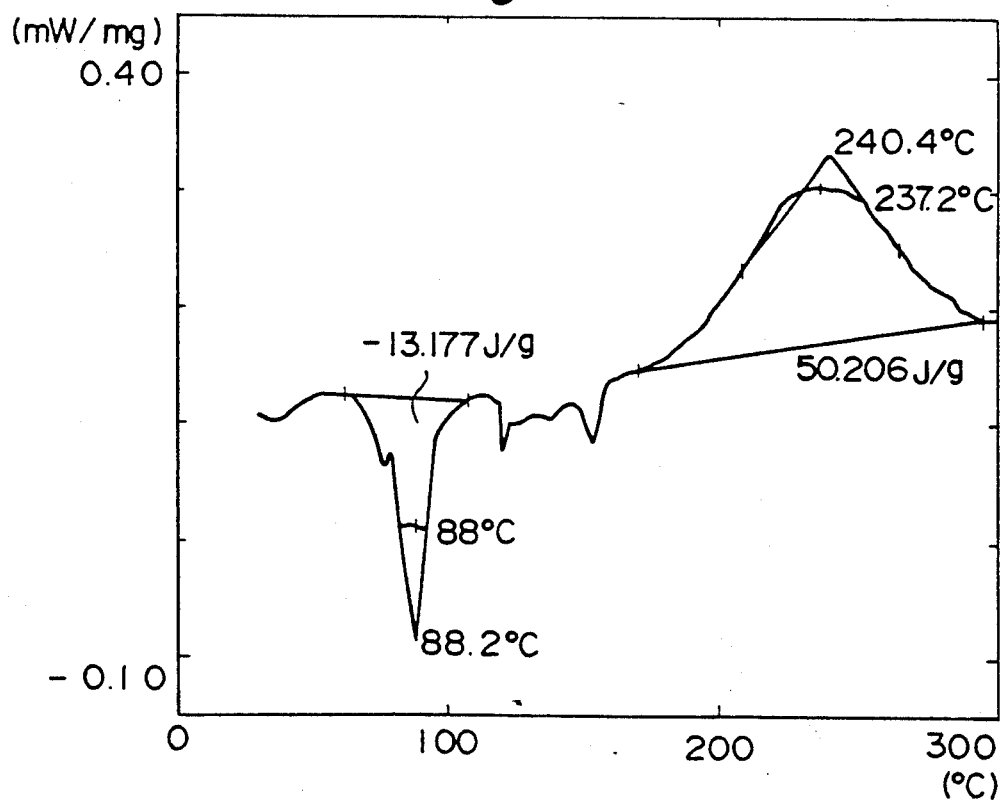
FIG. 2 is a graph showing a DSC curve of 2,2-bis[maleimide-p-(p-phenoxy)phenyl]propane.

FIG. 2 shows the DSC curve of 2,2-bis[maleimide-4-(4-phenoxy)phenyl]propane. The temperature for thermosetting of 2,2-bis[maleimide-4-(4-phenoxy)phenyl]- propane was about from 180° C. to 290° C. with a peak of about 240° C.

PREPARATION EXAMPLE 7

The procedure of Preparation Example 6 was repeated with the exception that the amount of 2,2-bis[-maleimide-4-(4-phenoxy)phenyl]propane was changed to 80 parts by weight per 100 parts by weight of the polyamic acid, i.e. to 6.00 kg, to obtain an adhesive composition.

EXAMPLES 1 TO 4

One surface of each of four sheets of UPILEX S of 25 μm thickness (Trade name of a polyimide film produced by Ube Industries, Ltd.) was subjected to continuous plasma treatment under the conditions; gas: oxygen, pressure for treatment: 0.1 torr, plasma power density: 26 W/cm², and time for the treatment: about 3 seconds. The treated surfaces were evenly coated, respectively, with the adhesive compositions prepared in Preparation Examples 1, 3, 4, and 6 using an applicator to a thickness of 50 μm. Each coated film was heated at 150° C. and 170° C. for 4 minutes respectively, and was then further heated at 170° C. for 10 minutes, to remove the solvent and to convert the polyamic acid to polyimide, and thus, a coverlay film with adhesive layer was obtained. The adhesive layer of each coverlay film was 10 μm in thickness.

After the heating, the volatile contents of the adhesive layers made of the adhesive compositions of Preparation Examples 1, 3, 4, and 6 were, respectively, 2.9% by weight, 2.1% by weight, 1.1% by weight, and 1.7% by weight.

Each coverlay film was attached to a sheet MCF-5000I (Trade name of a two-layer flexible copper-clad laminate (copper/polyimide) produced by Hitachi Chemical Company, Ltd.) the copper layer of which had been made into a circuit of three circuits per one mm width, by bringing the coated surface of the coverlay film into contact with the circuit side of the MCF-5000I. Each of the obtained composite was thermopressed for 60 minutes at 240° C. and at 50 kgf/cm², to obtain a flexible printed board covered with a coverlay film.

The properties of the obtained flexible printed boards covered with coverlay films are shown in Table 1.

Soldering stability was evaluated by floating a test piece on a solder bath at 350° C. for three minutes, and then observing the appearance of the test piece.

COMPARATIVE EXAMPLES 1 TO 3

The procedure of Examples 1 to 4 was repeated with the exception that the adhesive compositions prepared in Preparation Examples 2, 5, and 7 were used, to produce coverlay films and flexible printed boards covered with the coverlay films.

The properties of the obtained flexible printed boards covered with coverlay films are shown in Table 1.

TABLE 1

| | Adhesive composition | Bis-maleimide compound | Bis-maleimide compound content (part by weight/100 part by weight of polyamic acid) | Appearance*1 | Flexibility*2 | Soldering stability | Bond strength [kgf/cm] Room temperature | 105° C. |
|---|---|---|---|---|---|---|---|---|
| Example 1 | Preparation Example 1 | BMI | 20 | ○ | ○ | no blistering no delamination | 0.8 | 0.8 |
| Example 2 | Preparation Example 3 | BMI | 40 | ○ | ○ | no blistering no delamination | 0.8 | 0.8 |
| Example 3 | Preparation Example 4 | BMI | 60 | ○ | ○ | no blistering no delamination | 0.8 | 0.8 |
| Example 4 | Preparation Example 6 | BBMI | 60 | ○ | ○ | no blistering no delamination | 0.7 | 0.7 |
| Comparative Example 1 | Preparation Example 2 | BMI | 10 | X | ○ | blistering | 0.8 | 0.8 |
| Comparative Example 2 | Preparation Example 5 | BMI | 80 | ○ | X | no blistering | — | — |
| Comparative Example 3 | Preparation Example 7 | BBMI | 80 | ○ | X | no blistering no delamination | — | — |

*1 ○: No void was produced between copper foil or copper foil circuit and polyimide film.
X: Voids were produced between copper foil or copper foil circuit and polyimide film.
*2 ○: No crack was observed in adhesive layer after 200 times of MIT bending test (R 0.4).
X: Cracks were observed in adhesive layer after 200 times of MIT bending test (R 0.4).
BMI: N,N'-(methylene-di-p-phenylene)bis-maleimide
BBMI: 2,2-bis[maleimide-4-(4-phenoxy)phenyl]propane

EXAMPLE 5

The polyimide surface of a sheet of MCF-5000I (Trade name of a two-layer flexible copper-clad laminate (copper/polyimide) produced by Hitachi Chemical Company, Ltd.) was subjected to continuous plasma treatment under the conditions that; gas: oxygen, pressure for the treatment: 0.1 torr, output density of plasma electrode: 26 W/cm², and time for the treatment: about 3 seconds. Subsequently, the treated surface was evenly coated continuously with the adhesive composition prepared in Preparation Example 3 so that the thickness of the adhesive layer after the following heating would become about 10 μm. The adhesive layer was then air-dried at 150° C. and at 170° C. for 4 minutes respectively, to remove the solvent in the adhesive composition and to convert the polyamic acid to polyimide, and thus a MCF-5000I coated with an adhesive layer was obtained. The residual volatile content in the adhesive layer was 4.8% by weight.

The MCF-5000I coated with an adhesive layer was continuously laminated with another MCF-5000I coated with an adhesive layer which was produced in the same manner as described above, with their adhesive layers contacting each other at 240° C., at 30 kgf/cm², and at 0.5 m/min, by using a roll laminating machine as shown in FIG. 3. The roll laminating machine was composed of a pair of rolls, both the rolls being heating rolls. Thus obtained double-sided flexible copper-clad laminate was wound on a winding roll. The residual volatile content in the adhesive layer was reduced to 0.9% by weight while the double-sided flexible copper-clad laminate was being laminated and wound onto the winding roll.

The properties of the obtained double-sided flexible copper-clad laminate are shown in Table 2. FIG. 3 shows the relationship between temperature and the bond strength of the double-sided flexible copper-clad laminate. Measurement of bond strength was conducted according to IPC-FC-240C by using a power driven testing machine (cross head autographic type) under conditions of peering rate: 50 mm/min and sample width: 5 mm.

COMPARATIVE EXAMPLE 4

Figure 4:
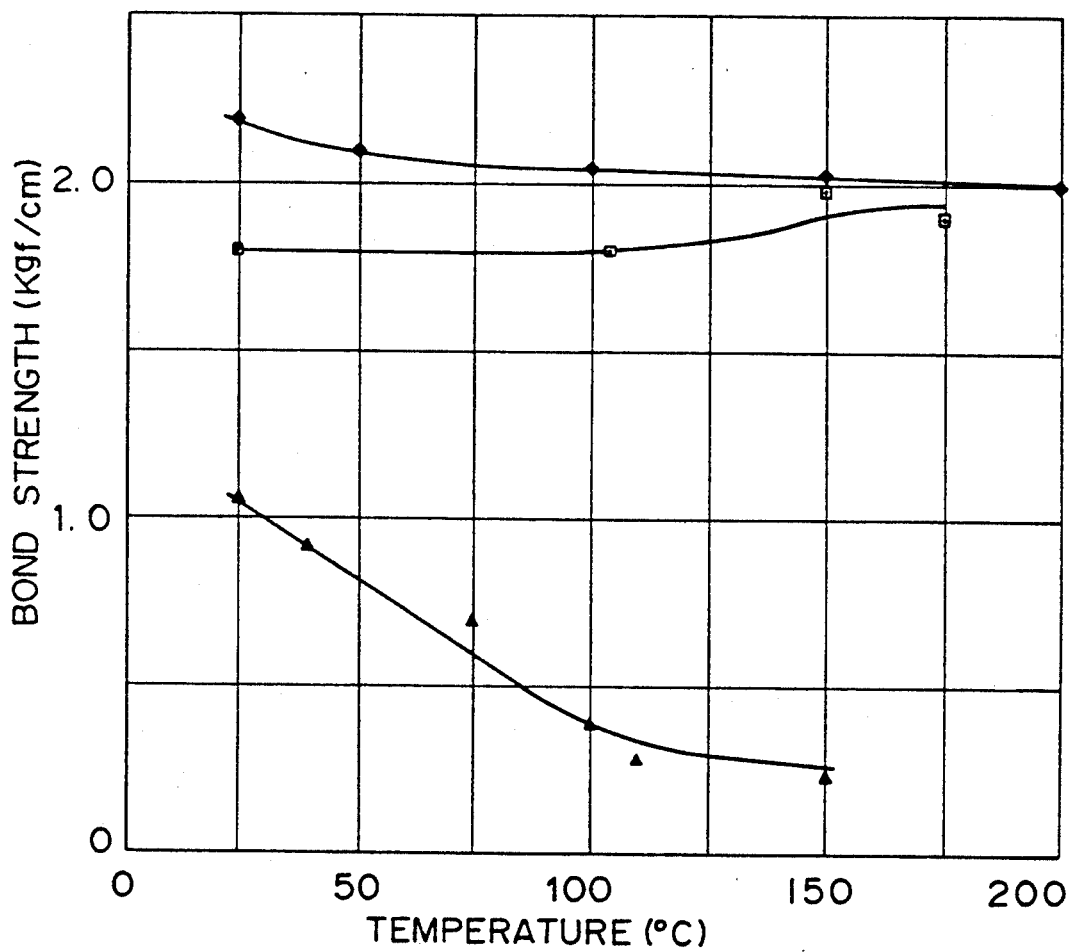
FIG. 4 is a graph showing the relation between temperature and the bond strength of the flexible copper-clad laminates produced in Example 5 and Comparative Example 5.

Both sides of a sheet of KAPTON 100 H (Trade name of a polyimide film of 25 μm thick produced by DuPont-Toray Co., Ltd.) were coated with an epoxy/NBR rubber adhesive (Trade name: H-2766, produced by Hitachi Kasei Polymer Co., Ltd.), and two sheets of electro-deposited copper foil of 18 μm thick (Trade name: JTC, produced by Nikko-Gould Foil Co., Ltd.) were laminated on the coated surfaces respectively, to obtain a double-sided flexible metal-clad laminate. The properties of the obtained double-sided flexible metal-clad laminate are shown in Table 2 and FIG. 4.

TABLE 2

| | Example 5 | Comparative Example 4 | Test method |
|---|---|---|---|
| Surface resistivity (Ω) | $1.2 \times 10^{14}$ | $4.0 \times 10^{13}$ | JIS C-6471 |
| Volume resistivity (Ω · cm) | $4.7 \times 10^{16}$ | $5.5 \times 10^{14}$ | JIS C-6471 |
| Insulation resistance (Ω) | $6.4 \times 10^{12}$ | $5.4 \times 10^{12}$ | IPC · FC240C |
| Dielectric constant | 3.7 | 4.4 | JIS C-6471 |
| Dielectric loss tangent | 0.0026 | 0.0184 | JIS C-6471 |
| Bond strength (kgf/cm) | | | JIS C-6471 |
| RT. | 2.2 | 1.05 | |
| 150° C. | 2.1 | 0.07 | |
| Soldering stability 350° C. · 3 min | OK | NG | |
| Chemical resistance | | | |
| toluene | OK | OK | IPC-FC240C |
| MEK | OK | OK | |
| MeOH | OK | OK | |
| 10% HCl | OK | OK | |
| 10% NaOH | OK | OK | |
| Flame resistance | OK | NG | UL-94 V-O |

RT: room temperature

COMPARATIVE EXAMPLE 5

The procedure of Example 5 was repeated with the exception that two sheets of MCF-5000I were not subjected to plasma treatment, to obtain a double-sided flexible copper-clad laminate. The bond strength between the two sheets of MCF-5000I and the adhesive was 0.03 kgf/cm, which is too small to bond them, and therefore the double-sided flexible copper-clad laminate could not be put to practical use.

What is claimed is:

1. A heat resistant adhesive composition comprising (A) a polyamic acid solution comprising a polyamic acid and a solvent, the polyamic acid capable of being converted into a polyimide having a glass transition temperature not higher than 260° C. by heating the polyamic acid to dehydrate the polyamic acid and (B) a bis-maleimide compound in an amount of from 20 to 60 parts by weight per 100 parts by weight of the polyamic acid.

2. The heat resistant adhesive composition as claimed in claim 1, wherein the polyamic acid has repeating units represented by the following formula (1):

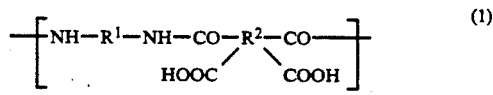

wherein
$R^1$ is

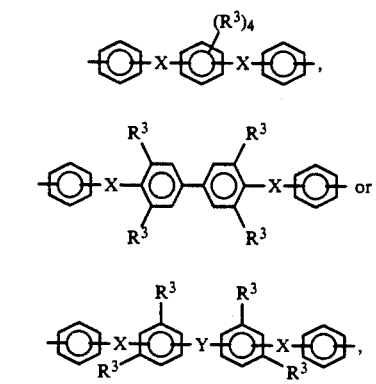

each $R^3$, respectively, being hydrogen, a halogen or an alkyl group of from 1 to 4 carbon atoms and each X and Y, respectively, being

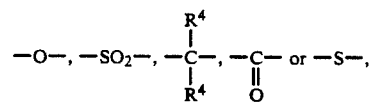

each $R^4$, respectively, being hydrogen, an alkyl group of from 1 to 4 carbon atoms or $-CF_3$,
$R^2$ is

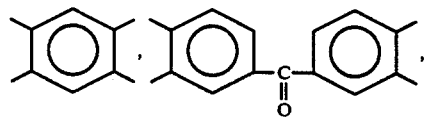

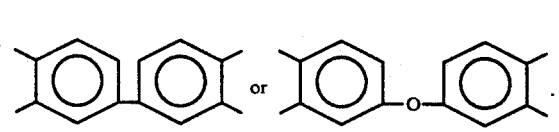

3. The heat resistant adhesive composition as claimed in claim 2, wherein the polyamic acid has repeating units represented by the following formula (2):

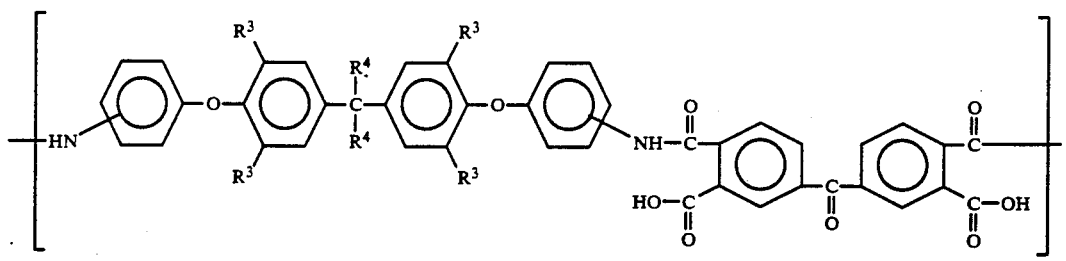

(2)

wherein
- each $R^3$, respectively, is hydrogen, a halogen or an alkyl group of from 1 to 4 carbon atoms, and
- each $R^4$, respectively, is hydrogen, an alkyl group of from 1 to 4 carbon atoms or —$CF_3$.

4. The heat resistant adhesive composition as claimed in claim 1, wherein the polyamic acid has a repeating unit represented by the following formula:

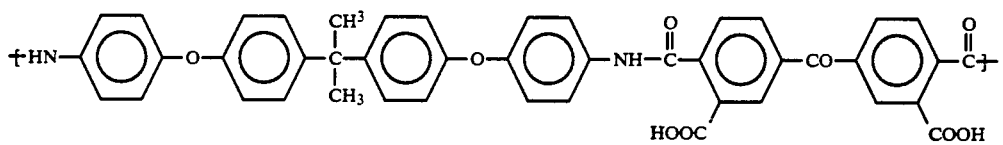

and the bis-maleimide compound has the structure represented by the following formula:

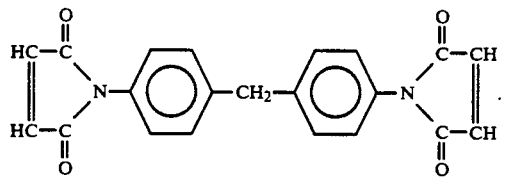

5. The heat resistant adhesive composition as claimed in claim 1, wherein the polyamic acid has a repeating unit represented by the following formula:

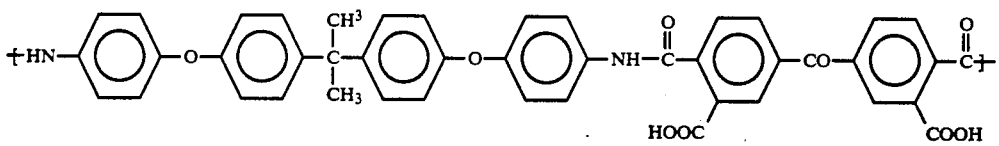

and the bis-maleimide compound has the structure represented by the following formula:

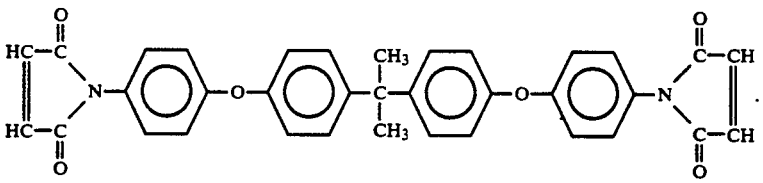

6. The heat resistant adhesive composition as claimed in claim 5, wherein the solvent is selected from the group consisting of N-methyl-2-pyrrolidone, N,N-dimethylformamide, N,N-dimethylacetamide, dimethyl sulfoxide, phenol, halogenated phenol, 1,4-dioxane, γ-butyrolactone, tetrahydrofuran, diethyleneglycol dimethyl ether and mixtures thereof; the weight ratio of the polyamic acid and the solvent being 5:95 to 25:75; the polyamic acid solution having a rotation viscosity of more than 500 poise; and the bis-maleimide compound being in an amount of 30 to 50 parts by weight.

7. The heat resistant adhesive composition as claimed in claim 4, wherein the solvent is selected from the group consisting of N-methyl-2-pyrrolidone, N,N-dimethylformamide, N,N-dimethylacetamide, dimethyl sulfoxide, phenol, halogenated phenol, 1,4-dioxane, γ-butyrolactone, tetrahydrofuran, diethyleneglycol dimethyl ether and mixtures thereof; the weight ratio of the polyamic acid and the solvent being 5:95 to 25:75; the polyamic acid solution having a rotation viscosity of more than 500 poise; and the bis-maleimide compound being in an amount of 30 to 50 parts by weight.

8. The heat resistant adhesive composition as claimed in claim 2, wherein the bis-maleimide compound is selected from the group consisting of one or more of
N,N'-m-phenylene-bis-maleimide,
N,N'-p-phenylene-bis-maleimide,
N,N'-(oxy-di-p-phenylene)bis-maleimide,
N,N'-(methylene-di-p-phenylene)bis-maleimide,
N,N'-(sulfone-di-p-phenylene)bis-maleimide, and
2,2-bis(maleimide-phenoxyphenyl)propanes.

9. The heat resistant adhesive composition as claimed in claim 8, wherein the bis-maleimide compound is in an amount of 30 to 50 parts by weight of the polyamic acid.

* * * * *